United States Patent [19]

Mitsuhashi et al.

[11] Patent Number: 4,950,870

[45] Date of Patent: Aug. 21, 1990

[54] HEAT-TREATING APPARATUS

[75] Inventors: Hiroyuki Mitsuhashi; Seishiro Sato, both of Machida; Wataru Ohkase, Sagamihara, all of Japan

[73] Assignee: Tel Sagami Limited, Kanagawa, Japan

[21] Appl. No.: 273,972

[22] Filed: Nov. 21, 1988

[30] Foreign Application Priority Data

Nov. 21, 1987 [JP] Japan .................. 62-294962

[51] Int. Cl.⁵ .............................. H05B 3/64
[52] U.S. Cl. .................... 219/390; 219/411
[58] Field of Search ............ 219/390, 405, 411, 388, 219/354, 389, 388 S; 337/117; 432/107, 112; 118/725, 50.1

[56] References Cited

U.S. PATENT DOCUMENTS

| | | | |
|---|---|---|---|
| 2,145,324 | 1/1939 | Stauss | 219/390 |
| 3,140,965 | 7/1964 | Reuschel | 118/725 |
| 3,603,284 | 9/1971 | Garnache . | |
| 3,804,967 | 4/1974 | Werych | 219/390 |
| 3,828,722 | 8/1974 | Reuter et al. . | |
| 4,348,580 | 9/1982 | Drexel | 219/390 |
| 4,461,783 | 7/1984 | Yamazaki . | |
| 4,464,415 | 8/1984 | Yamazaki . | |
| 4,492,716 | 1/1985 | Yamazaki . | |
| 4,543,267 | 9/1985 | Yamazaki . | |
| 4,545,327 | 10/1985 | Campbell | 219/411 |
| 4,579,080 | 4/1986 | Martin . | |

FOREIGN PATENT DOCUMENTS

| | | | |
|---|---|---|---|
| 53-123667 | 10/1978 | Japan . | |
| 58-182 | 1/1983 | Japan . | |
| 513043 | 12/1937 | United Kingdom | 219/390 |

OTHER PUBLICATIONS

Denshi Zairyo (Electronic Material), 1982, Supplement, pp. 72–73.

*Primary Examiner*—Teresa J. Walberg
*Attorney, Agent, or Firm*—Oblon, Spivak, McClelland, Maier & Neustadt

[57] ABSTRACT

A heat-treating apparatus includes a process tube accommodating an object to be heat-treated therein, and a plurality of independent heaters including at least three heaters arranged at both end portions and the central portion of a side wall of the process tube, so as to surround the process tube and, the heating temperatures of the individual heaters being freely adjustable. In this heat-treating apparatus, no direct heat transfer is caused between the heaters, so that the heating temperature of the heater at each end portion of the process tube can be adjusted to a high value, without entailing such an uneven temperature distribution as is caused in the case of a conventional heat-treating apparatus. Thus, uniform temperature distribution can be attained in an area covering the same range for the conventional apparatus, even though the heaters at both end portions are reduced in length.

6 Claims, 11 Drawing Sheets

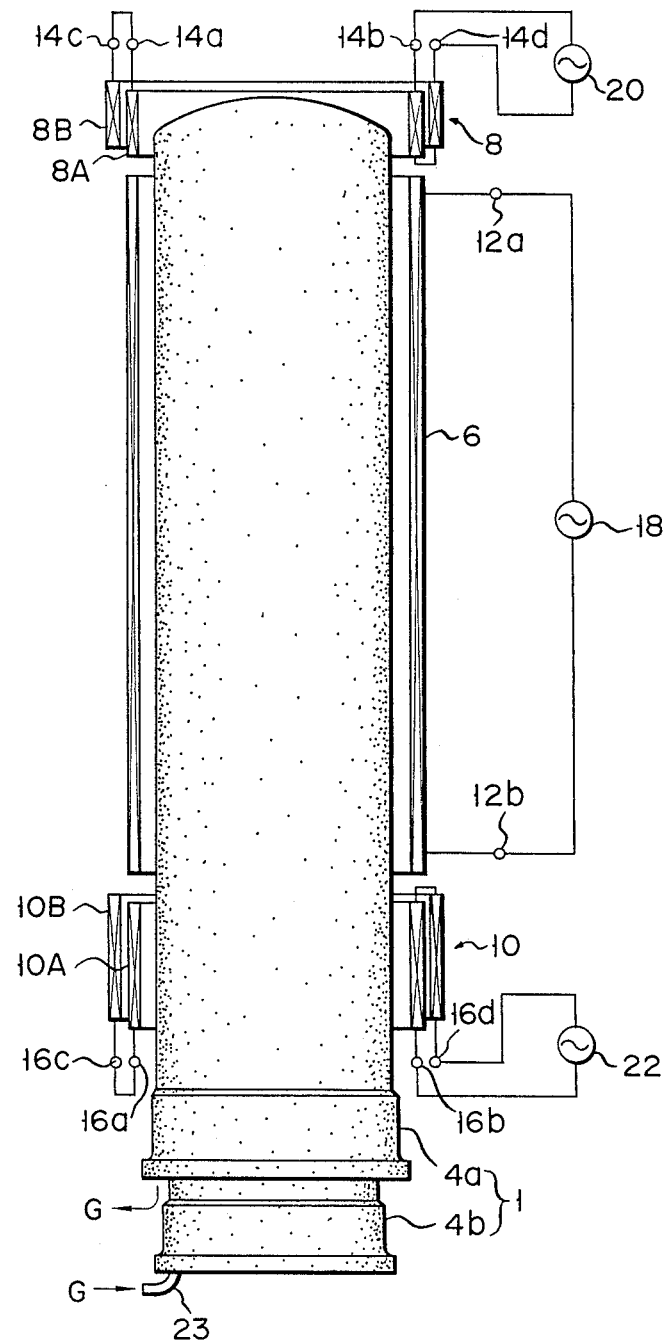
F I G. 2

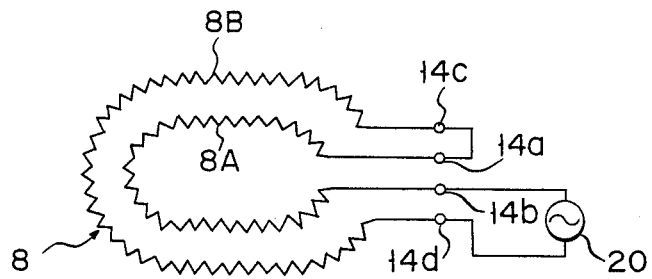
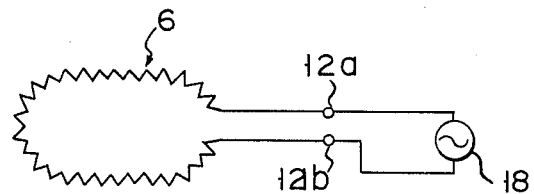
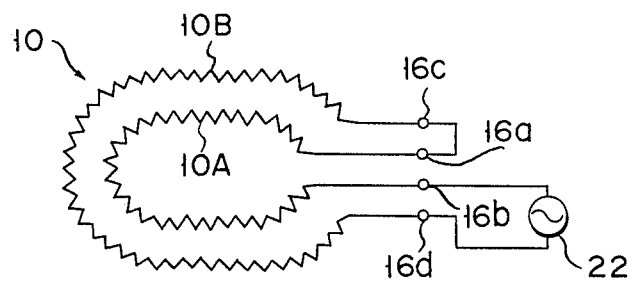
F I G. 3

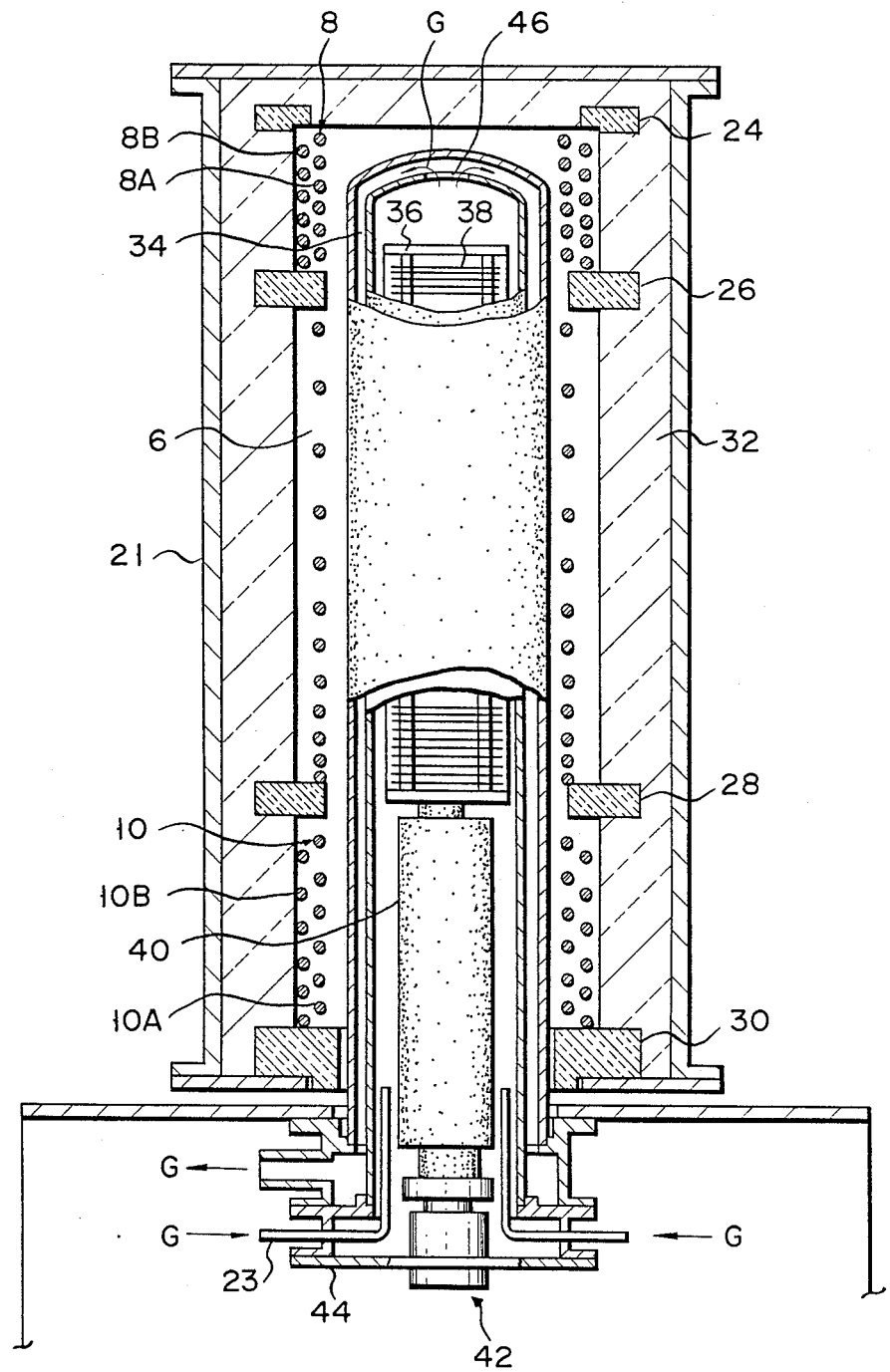
F I G. 4

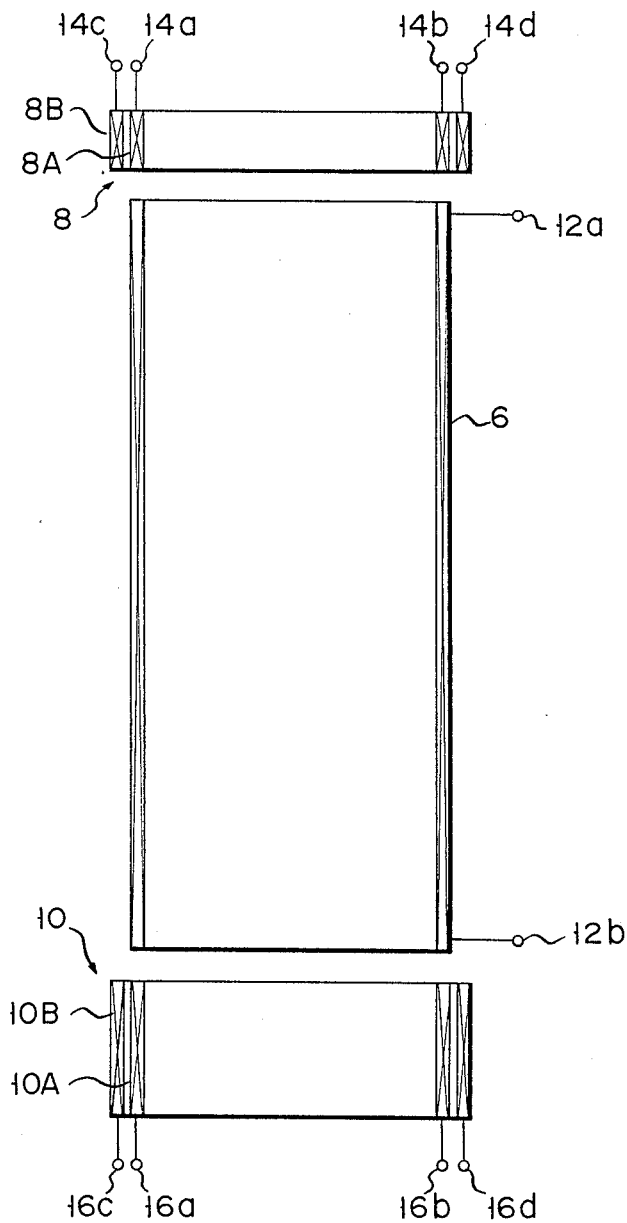
F I G. 6A

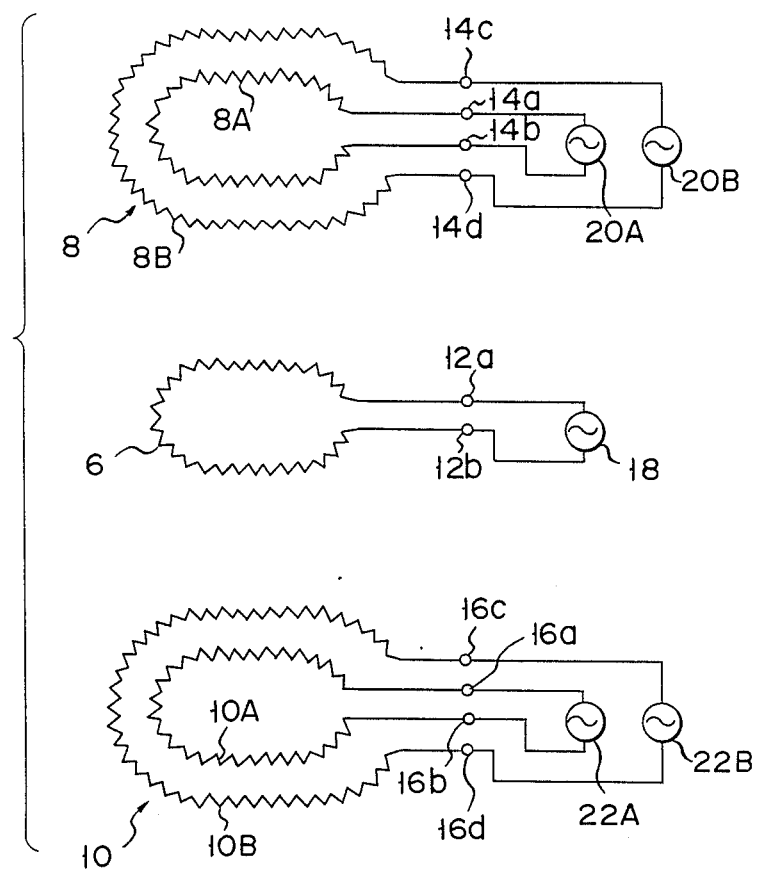
F I G. 6B

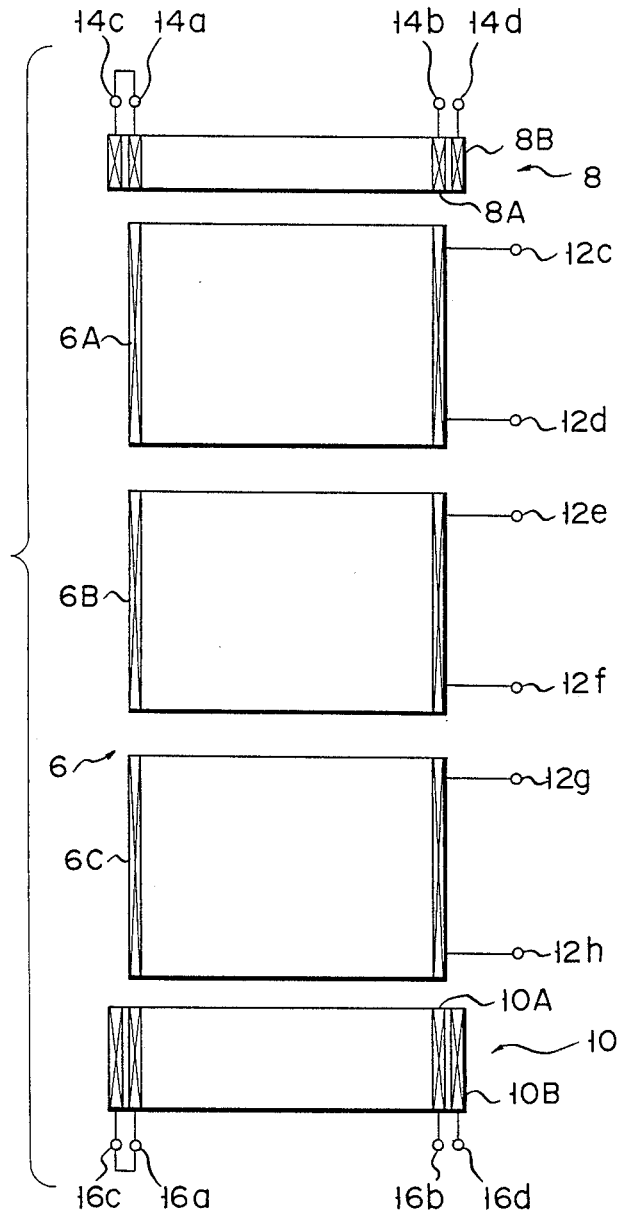
F I G. 7A

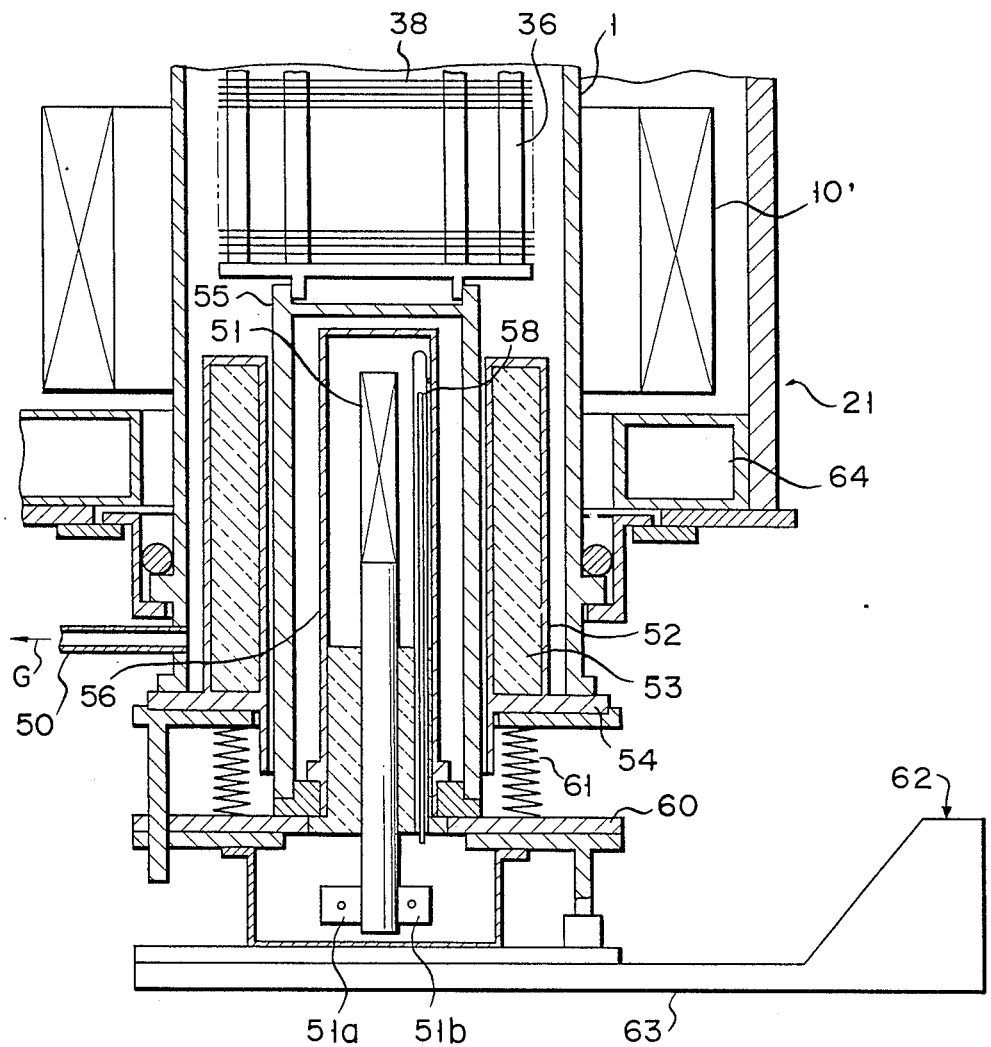
F I G. 9

HEAT-TREATING APPARATUS

BACKGROUND OF THE INVENTION

1. Field of the Invention

The present invention relates to a heat-treating apparatus used in the manufacture of a semiconductor device, such as an IC, and adapted for the low-pressure CVD, impurity diffusion and so on.

2. Description of the Prior Art

Many conventional heat-treating apparatuses, e.g., low-pressure CVD apparatuses, are of a horizontal-furnace type in which a furnace body for heat treatment is set horizontally. Recently, however, heat-treating apparatuses of a vertical-furnace type have started to be used, providing the following advantages.

A first advantage of the vertical-furnace type is that the installation area for the apparatus can be reduced. Naturally, a horizontal-furnace heat-treating apparatus requires an installation area proportional to the length of the furnace. In contrast with this, the installation area for a vertical-furnace apparatus depends only on the diameter of the furnace. In general, the furnace diameter is shorter than the furnace length, so that the installation area for the vertical-furnace type is smaller. Since semiconductor wafers are aligned successively in the furnace during heat treatment, moreover, the furnace length is extended in proportion to the processing capacity, while the furnace diameter has no relation to the capacity. Thus, the higher the processing capability, the greater the advantage of the vertical-furnace type, with respect to the installation area.

A second advantage of the vertical-furnace type is that a vertical convection of gas can be utilized for the supply of working gas to the furnace.

One of the most important requisites of a heat-treating apparatus, whether horizontal or vertical, is the uniformity of temperature distribution along the length of the inside of the furnace. If the temperature distribution is uneven, semiconductor wafers treated in the same lot will be subject to variation in quality. In this regard, the vertical-furnace heat-treating apparatus is inferior to the horizontal-furnace apparatus. This is because heat, in the vertical-furnace type, is transferred upward by the convection, so that the temperature of the top portion of the furnace increases cumulatively. Such accumulation of heat entails thermal fatigue of the heater means.

For avoiding the variation in quality of the wafers treated in the same lot, the heat-treating apparatus is designed so that uniform temperature distribution is attained in a predetermined limited region inside the furnace, and the semiconductor wafers are heat-treated only within this region. This is because a low-temperature region is inevitably created at each end of the furnace, due to an effect of heat radiation to the periphery, so that the internal temperature cannot be made uniform throughout the length of the furnace. In order to improve the production capability of the heat-treating apparatus, it is essential to increase the percentage of a uniform-temperature region. Also in this regard, the vertical-furnace type is handicapped due to the heat convection described above.

One such conventional heat-treating apparatus has means for attaining uniform temperature distribution in a wider region inside the furnace in a steady state. As shown in FIG. 1, this means includes divided heater 2 which surrounds process tube 1. Heater 2, which is formed of an integrated resistance wire, is divided into three portions $3a$, $3b$ and $3c$ by means of terminals T1 to T4, for example. Currents flowing through resistors $3a$, $3b$ and $3c$ can be independently controlled by separately setting supply voltages applied between terminals T1 and T2, between T2 and T3, and between T3 and T4. In this prior art apparatus, heating temperatures at both end portions are increased by making the currents flowing through end resistors $3a$ and $3c$ greater than the current flowing through central resistor $3b$. Thus, the effect of heat radiation at both ends of the process tube is compensated, so that a uniform-temperature region in the central portion is made wider than in the case where all resistors $3a$, $3b$ and $3c$ have the same heating temperature.

Even with use of the divided heater as described above, however, the efficiency of temperature control at both ends of the process tube is not very high. It is difficult, therefore, to increase the percentage of the uniform-temperature region by shortening resistors $3a$ and $3c$. If resistors $3a$ and $3c$ are enhanced in heating temperature and reduced in length, for example, uneven, irregular temperature distribution is observed at the boundary regions between these end resistors and central resistor $3b$. The inventors hereof found that this phenomenon is attributable to heat transfer between resistors $3a$, $3b$ and $3c$.

SUMMARY OF THE INVENTION

An object of the present invention is to provide a heat-treating apparatus capable of attaining uniform temperature distribution in a wider region inside a process tube.

The above object can be achieved by a heat-treating apparatus comprising a process tube accommodating an object to be heat-treated therein, and a plurality of independent heaters including at least three heaters arranged at both end portions and the central portion of a side wall of the process tube, so as to surround the process tube, the heating temperatures of the individual heaters being freely adjustable.

In the heat-treating apparatus of the present invention, as compared with the prior art apparatus of FIG. 1, resistors $3a$, $3b$ and $3c$ as shown in FIG. 1 are not connected to each other, so that there is no direct heat transfer between them. Accordingly, the heating temperatures of end resistors $3a$ and $3c$ can be set to be higher than in the case of the conventional apparatus, without entailing such an irregular temperature distribution as the conventional apparatus suffers. In consequence, uniform temperature distribution can be attained in a region covering the same range for the conventional apparatus even though resistors $3a$ and $3c$ are reduced in length. This indicates that uniform temperature distribution can be attained in a wider region than in the conventional case if uneven-temperature regions such as those in the prior art apparatus are permitted at both ends.

Another object of the present invention is to provide a vertical-type heat-treating apparatus capable of reducing thermal fatigue of heater means and electric power loss. This second object is achieved in the manner which will be apparent in the following detailed description.

BRIEF DESCRIPTION OF THE DRAWINGS

FIG. 2 is a diagram showing a furnace of a heat-treating apparatus according to an embodiment of the present invention;

FIG. 3 is an equivalent circuit diagram of heater means of the furnace of FIG. 2;

FIG. 4 is a sectional view more specifically showing the heat-treating apparatus using the furnace of FIG. 2;

FIG. 6A is a diagram showing a modification of the heater means of the furnace of FIG. 2;

FIG. 6B is an equivalent circuit diagram of the heater means of FIG. 6A;

FIG. 7A is a diagram showing another modification of the heater means of the furnace of FIG. 2;

FIG. 9 is an enlarged sectional view showing part of the heat-treating apparatus using the furnace of FIG. 8.

DETAILED DESCRIPTION OF THE PREFERRED EMBODIMENTS

Figure 1:
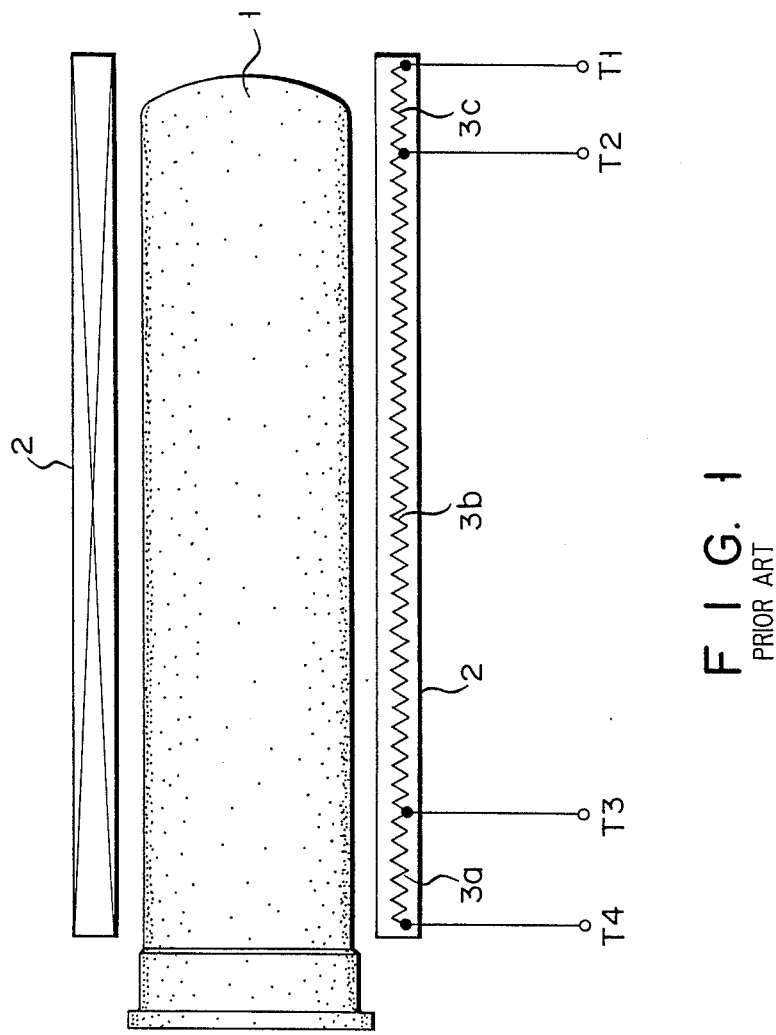
FIG. 1 is a diagram schematically showing divided heater means used in a prior art heat-treating apparatus.

The following is a description of preferred embodiments of the present invention applied to a heat-treating apparatus of a vertical-furnace type, although the invention is not limited to apparatuses of this type.

FIG. 2 shows an embodiment of a furnace which constitutes a heat-treating apparatus according to the present invention. In FIG. 2, numeral 1 designates a vertical process tube which is formed of quartz or silicon carbide and has a double-tube structure composed of outer and inner tubes 4a and 4b. Working gas G fed from supply tube 23 to inner tube 4b is discharged through the gap between inner and outer tubes 4b and 4a. Three independent heaters 6, 8 and 10 are arranged around process tube 1 corresponding to the central, top, and bottom portions, respectively. Each formed of a heat-generative resistor coil or coils, heaters 6, 8 and 10 are connected to independent power sources 18, 20 and 22, respectively. Heater 6 is formed of a single coil, while heaters 8 and 10 have a double-coil structure. More specifically, heater 8 is formed of two coils 8A and 8B, and heater 10 is also formed of two coils 10A and 10B. FIG. 3 shows equivalent circuits of heaters 6, 8 and 10. Heater 6 is provided with terminals 12a and 12b, which are connected to power source 18. Coil 8A of heater 8 has terminals 14a and 14b, and coil 8B has terminals 14c and 14d. There is a short circuit between terminals 14a and 14c, while terminals 14b and 14d are connected to power source 20. Also in heater 10, there is a short circuit between terminals 16a and 16c, among terminals 16a, 16b, 16c and 16d attached to coils 10A and 10B; while terminals 16b and 16d are connected to power source 22. Heaters 6, 8 and 10 are heated by current supplied from independent power sources 18, 20 and 22, respectively, thus serving to heat process tube 1.

Corresponding to cylindrical process tube 1, all heaters 6, 8 and 10 are cylindrical in shape. These heaters are disposed on the outer peripheral surface of tube 1 so that their central axes are in alignment with the axis of the tube. That area of process tube 1 heated by central heater 6 is an area in which semiconductor wafers are to be heat-treated. The apparatus is designed so that uniform temperature distribution is attained in this area. Top and bottom heaters 8 and 10 serve to compensate for the effect of heat radiation at both ends of the process tube, thereby permitting uniform temperature distribution in the whole central area of the tube. As mentioned before, a general purpose of the present invention is to minimize the axial lengths of heaters 8 and 10.

In the arrangement shown in FIG. 2, the amount of heat per unit area generated by top and bottom heaters 8 and 10 is adjusted to twice that for central heater 6, or more. It is to this end that end heaters 8 and 10 are designed for the double-coil structure, as compared with the single-coil structure of central heater 6. Even if the amount of heat from heaters 8 and 10 is increased, the central area of the process tube will not be subject to any uneven, irregular temperature distribution. This is because end heaters 8 and 10 are entirely isolated from central heater 6 to prevent direct heat transfer. Further, the arrangement of FIG. 2 is effected in consideration of convective accumulation of heat in the top area. The heating area of top heater 8 is shorter than that of bottom heater 10. The coil density of the heat-generative resistor, which constitutes central heater 6, becomes lower in proportion to distance from the lower end of heater 6. Thus, the heat accumulation at the top area can be compensated to provide uniform temperature distribution. Moreover, temperature distribution with a desired gradient may be obtained as required.

FIG. 4 is a sectional view more specifically showing the heat-treating apparatus using the furnace of FIG. 2. In FIG. 4, numeral 21 designates an outer wall of the apparatus. The furnace of FIG. 2 is set vertically inside wall 21. Outside the furnace, retaining frames 24, 26, 28 and 30 are arranged at intervals corresponding individually to the lengths of heaters 8, 6 and 10. The three heaters are located between these retaining frames. Frames 24, 26, 28 and 30 are formed of an adiabatic material, so that heat transfer between heaters 6, 8 and 10 is prevented. Frame 30 serves to prevent overheating at the open end portion of the heat-treating apparatus. Adiabatic material 32 is packed between the heaters and outer wall 21, whereby wall 21 is prevented from being over-heated.

Figure 5A:
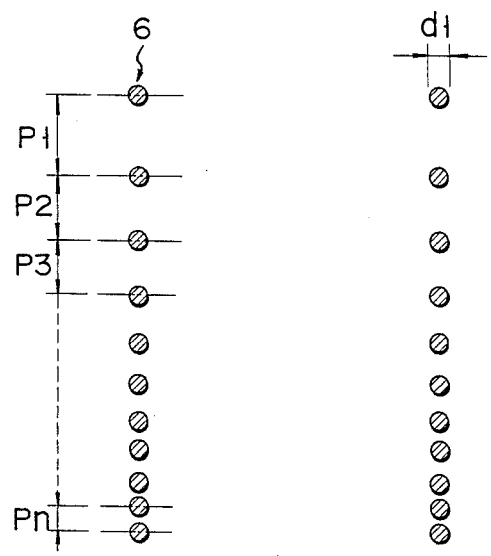
FIGS. 5A and 5B are sectional views showing the heater arrangement of the heat-treating apparatus of FIG. 4 in further detail.
Figure 5B:
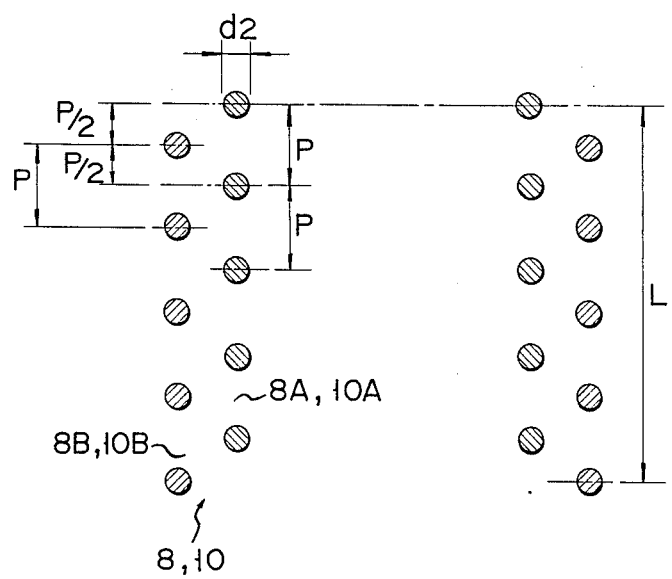

FIG. 5A illustrates pitches of the coil constituting heater 6, and FIG. 5B illustrates pitches of coils constituting heaters 8 and 10. As seen from FIG. 5A, there are relations $P1 > P2 > P3 \ldots Pn$ where $P1, P2, P3 \ldots Pn$ are the coil pitches of heater 6 as named from top to bottom. In order to make the temperature distribution inside process tube 1 uniform, as mentioned before, the pitch size is gradually reduced in distance from the top end of the coil.

As seen from FIG. 4B, inner coils 8A and 10A and outer coils 8B and 10B of heaters 8 and 10 have the same pitch P. Also, there is a locational offset of P/2 between inner coils 8A and 10A and their corresponding outer coils 8B and 10B.

Length L of each coil is properly set corresponding to the length of process tube 1. As shown in FIG. 2, upper heater 8 is made shorter in length than lower heater 10. This is done in order to compensate for the convective heat accumulation in the top portion, as described before. The coil diameter of heaters 8 and 10 (d2) is greater than that of heater 6 (d1). Thus, the amount of heat per unit area from both end heaters 8 and 10 can be increased, and the thermal durability of top heater 8, which is subjected to accumulated heat, can be improved.

In heat-treating semiconductor wafers by means of the apparatus of this embodiment, as shown in FIG. 4, a number of semiconductor wafers 38 held in quartz boat 36 are stored in inner tube 4b of the process tube. Boat 36 is supported by means of heat insulating cylinder 40. Cylinder 40 serves to maintain the temperature of the area around the inlet/outlet aperture of the apparatus, as well as to support the boat. Rotating mechanism 42 is disposed at the lower end portion of cylinder 40, whereby semiconductor wafers are rotated as they are heat-treated. In order to seal the process tube during the heat treatment, moreover, plug 44 is used to close the aperture.

Working gas G for the heat treatment is introduced into inner tube 4b of the process tube through supply tube 23, as mentioned before. The introduced gas is brought into contact with semiconductor wafers 38 to effect a predetermined heat treatment. In doing this, wafers 38 are rotated for uniform contact with the gas. Thereafter, the working gas is delivered to an exhaust portion (not shown) through opening 46 at the top portion of the inner tube 4b and gap 34 between inner and outer tubes 4b and 4a.

The arrangement of the heaters according to the aforementioned embodiment may be changed or modified by one skilled in the art without departing from the scope or spirit of the present invention. FIGS. 6A and 6B and FIGS. 7A and 7B show modifications of the heater arrangement.

FIG. 6A shows a modification of the heater means, and FIG. 6B is an equivalent circuit diagram of the modified heater means. In this example, coils 8A and 8B of top heater 8 are connected to independent power sources 20A and 20B, respectively, without a short circuit between coils 8A and 8B. Likewise, coils 10A and 10B of bottom heater 10 are connected to independent power sources 22A and 22B, respectively. Thus, five independent drive circuits in all are formed including the central heater. In this modification, the amount of heat generated by top and bottom heaters 8 and 10 can be controlled over a wider range.

Figure 7B:
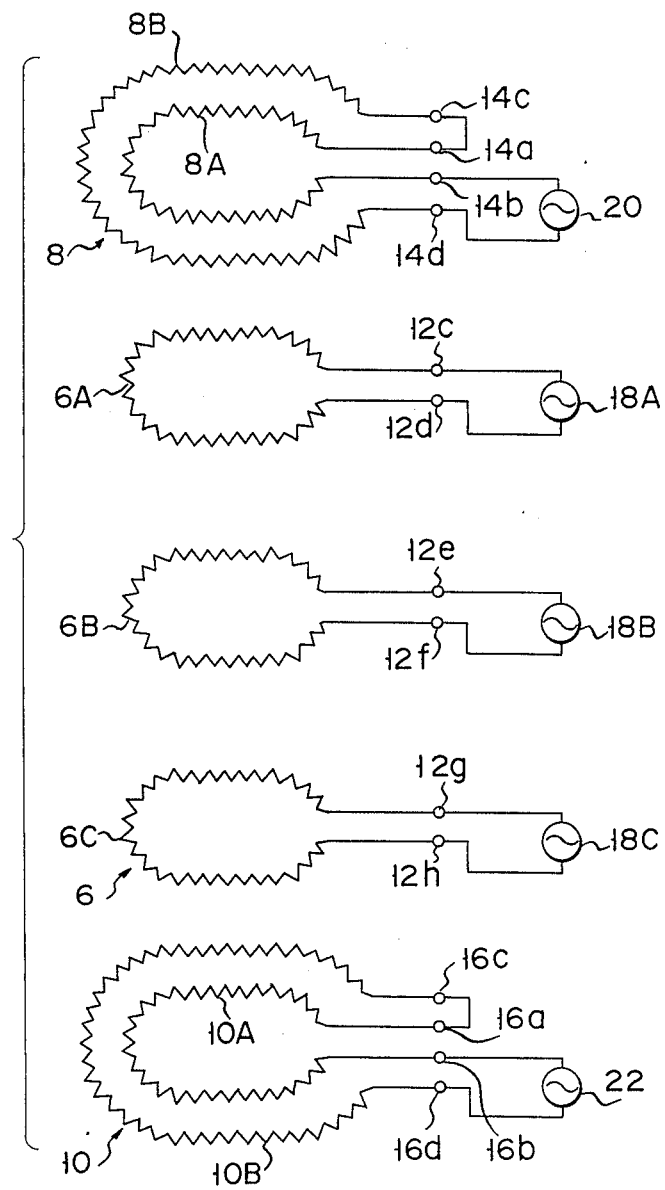
FIG. 7B is an equivalent circuit diagram of the heater means of FIG. 7A.

FIG. 7A shows another modification of the heater means, and FIG. 7B is an equivalent circuit diagram of the modified heater means. Although top and bottom heaters 8 and 10 of this modification are arranged in the same manner as the ones shown in FIGS. 2 and 3, the central heater means is arranged differently. More specifically, the central heater means is composed of three heaters 6A, 6B and 6C which are connected to independent power sources 18A, 18B and 18C, respectively. Power source 18A is connected to terminals 12c and 12d of heater 6A, power source 18B is connected to terminals 12e and 12f of heater 6B, and power source 18C is connected to terminals 12g and 12h of heater 6C. This modification can be effectively used when the process tube of the heat-treating apparatus is relatively long.

Although a process tube with a double-tube structure is used in the embodiment described above, the present invention may be also applied to a process tube with a single-tube structure.

In top and bottom heaters 8 and 10 at the opposite end portions of the process tube, moreover, the coils may be arranged in three layers for a greater amount of heat generation. In contrast with this, the end heaters may be formed of single-layer coils.

Furthermore, all heaters 6, 8 and 10 may be made of a wire having equal diameter, or top and bottom heaters 8 and 10 may be made equal in length.

Figure 8:
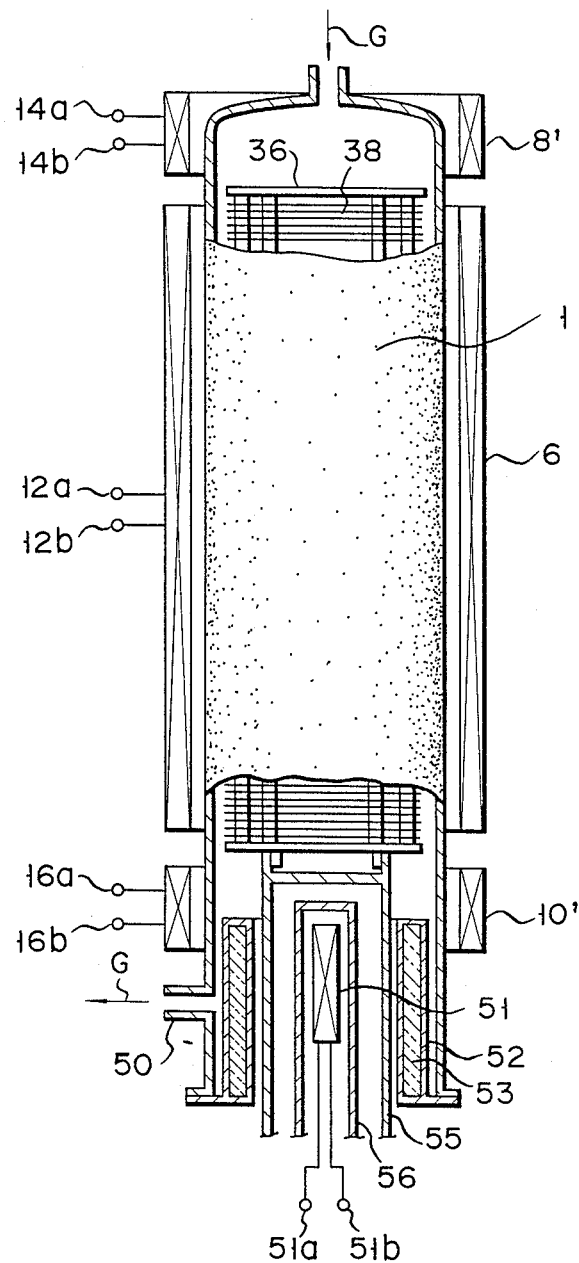
FIG. 8 is a diagram showing a furnace of a heat-treating apparatus according to another embodiment of the present invention.

Referring now to FIGS. 8 and 9, another embodiment of the present invention will be described.

FIG. 8 shows a heat-treating apparatus according to the second embodiment of the invention, and FIG. 9 illustrates the lower end portion of the apparatus in detail. In this embodiment, process tube 1 is of a single-tube structure. Working gas G is introduced through the top portion of tube 1, and is discharged through exhaust port 50 in the lower end portion. Three independent heaters 6, 8', and 10', having the same construction as those of the foregoing embodiment, are provided on the side wall of process tube 1. End heaters 8' and 10' are formed of a single-layer coil each. This embodiment is characterized in that independent heater 51 is attached to a plug used to close an inlet/outlet aperture at the lower end portion of the process tube. The plug is composed of outer cylinder 52, which is filled with adiabatic material 53, and inner cylinder 55 having protective cylinder 56 therein. FIG. 9 shows the construction of the plug in detail.

In FIG. 9, outer cylinder 52 is provided with flange 54, and adiabatic material 53 serves to prevent heat from spreading toward an opening of process tube 1. Inner cylinder 55 is located inside of outer cylinder 52, so as to be removable. Thus, it serves as a support member for supporting quartz boat 36 which contains semiconductor wafers 38 therein. Heater 51, along with thermocouple thermometer 58, is disposed inside protective cylinder 56 which is located inside inner cylinder 55. Cylinder 56 serves to intercept working gas G in process tube 1, thereby preventing heater 51 from deteriorating due to contact with the gas. Further, heater 51 is provided with terminal electrodes 51a and 51b, which are connected to a power source (not shown). Numeral 60 designates a support base which is fixed to arm portion 63 of lift 62. Bellows 61 is disposed between support base 60 and flange 54 of outer cylinder 52. Cooling water passage 64 is formed inside the lower end portion of outer wall 21. The apparatus can be cooled by circulating cooling water through passage 64.

In the embodiment shown in FIGS. 8 and 9, the inlet/outlet aperture at the bottom portion of process tube 1 is also heated independently by means of additional heater 51. The aperture region is most influenced by radiation of heat. Therefore, the temperature distribution inside the process tube can be made further uniform by the use of heater 51.

The heater for heating the bottom opening portion of the process tube, used in the embodiment of FIGS. 8 and 9, may be applied independently, without being combined with the heater within the scope of the present invention. In the embodiment shown in FIGS. 8 and 9, for example, even if the conventional heater means as shown in FIG. 1 is used for the side wall of the process tube, the additional use of heater 51 can produce a predetermined effect.

What is claimed is:
1. A heat-treating apparatus comprising:
   a process tube accommodating an object to the heat-treated therein; and
   a plurality of independent heaters including at least three heaters comprised of a top heater, a central heater and a bottom heater which are arranged at the top portion, the central portion and the bottom portion of a side wall of the process tube respectively, so as to surround the process tube, said plurality of independent heaters being absent any electrical connection to each other, the heating temperatures of said plurality of independent heaters being freely adjustable, each of said independent heaters being formed of a resistance wire coil wound around the process tube, and the wire diameter of at least the top heater being greater than that of the central heater.

2. The heat-treating apparatus according to claim 1, wherein the heating temperature of said heater at each end portion of the side wall of the process tube is higher than that of the heater at the central portion.

3. The heat-treating apparatus according to claim 1, wherein at least the heaters at both end portions, among said plurality of independent heaters, have a multi-layer structure.

4. The heat-treating apparatus according to claim 1, wherein the heater at the top portion of the process tube is shorter in length than the heater at the bottom portion.

5. The heat-treating apparatus according to claim 1, further comprising another independent heater located outside a plug for closing an inlet/outlet aperture at the lower end portion of the process tube.

6. A heat-treating apparatus comprising:
   a vertical process tube accommodating an object to be heat-treated therein;
   a plurality of independently powered heaters including at least three heaters arranged at both end portions and the central portion of a side wall of the process tube, so as to surround the process tube, the heating temperatures of said plurality of independently powered heaters being freely adjustable;
   the at least three heaters are comprised of a top heater, a central heater and a bottom heater, said top and bottom heaters having a double-coil structure, and said central heater having a single-coil structure;
   a plurality of frames made of an adiabatic material placed between and connected to said plurality of heaters; and
   said single-coil structure of said central heater increasing in density from the top of said central heater to the bottom of said central heater so as to provide uniform temperature distribution inside said vertical process tube.

* * * * *